US009942992B2

(12) United States Patent
Leshniak et al.

(10) Patent No.: US 9,942,992 B2
(45) Date of Patent: Apr. 10, 2018

(54) METHODS FOR ASSEMBLING LED CONNECTOR BOARD

(71) Applicant: AMERLUX LLC, Fairfield, NJ (US)

(72) Inventors: Itai Leshniak, Fair Lawn, NJ (US); Paresh Shah, Fairfield, NJ (US); Jonathan Walsh, Fairfield, NJ (US)

(73) Assignee: AMERLUX LLC, Oakland, NJ (US)

( * ) Notice: Subject to any disclaimer, the term of this patent is extended or adjusted under 35 U.S.C. 154(b) by 175 days.

(21) Appl. No.: 14/850,746

(22) Filed: Sep. 10, 2015

(65) Prior Publication Data

US 2016/0113122 A1 Apr. 21, 2016

Related U.S. Application Data

(60) Provisional application No. 62/048,688, filed on Sep. 10, 2014.

(51) Int. Cl.
H05K 3/30 (2006.01)
H01R 4/02 (2006.01)
H05K 1/02 (2006.01)

(52) U.S. Cl.
CPC ............ H05K 3/30 (2013.01); H01R 4/023 (2013.01); H05K 1/0265 (2013.01); H05K 2201/09118 (2013.01); H05K 2201/10106 (2013.01); H05K 2201/10272 (2013.01); Y10T 29/4913 (2015.01); Y10T 29/49126 (2015.01)

(58) Field of Classification Search
CPC ...... F21V 23/005; F21V 29/508; F21V 29/74; H05K 2201/10106; H01H 2235/028; Y10T 29/4913; Y10T 29/49126

USPC .......... 29/832, 739, 825, 830, 835, 846, 848
See application file for complete search history.

(56) References Cited

U.S. PATENT DOCUMENTS 7,828,557 B2 * 11/2010 Vogt .................... H01R 4/4818
439/441
7,892,022 B2 * 2/2011 Mostoller ........... F21V 19/0055
439/507
2013/0230995 A1 9/2013 Ivey et al.
2014/0049956 A1 2/2014 Manahan et al.
2014/0120756 A1 5/2014 Leshniak et al.

FOREIGN PATENT DOCUMENTS

EP 2413015 A1 2/2012
SU 1403157 A1 6/1988

OTHER PUBLICATIONS

International Search Report and the Written Opinion of the International Search Report, issued in corresponding application No. PCT/US2015/049481, dated Feb. 4, 2016.

* cited by examiner

Primary Examiner — Thiem Phan
(74) Attorney, Agent, or Firm — Day Pitney LLP

(57) ABSTRACT

Systems and methods for assembling an LED connector board wherein the assembly can be provided with a metal track with an integrated recess for receiving an injection molded base, onto which a set of leaf spring connectors with extended insulating bosses for electrical wires can be secured.

3 Claims, 13 Drawing Sheets

METHODS FOR ASSEMBLING LED CONNECTOR BOARD

CROSS-REFERENCE TO RELATED APPLICATION

This patent application claims the benefit of priority to U.S. Provisional Patent Application Ser. No. 62/048,688, filed Sep. 10, 2014, the content of which is incorporated herein by reference in its entirety for any purpose whatsoever.

FIELD

The present disclosure relates to systems and methods for assembling LED connector boards.

BACKGROUND

LED connection systems are known. However, the current state of the art has certain shortcomings, as appreciated by Applicant as described herein. The present disclosure presents improvements over the state of the art.

SUMMARY OF THE DISCLOSURE

LED lighting systems and methods for assembling LED connector boards are disclosed herein.

To maximize LED light dispersion and distribution, the profile of LED connector board assemblies can be optimized so as to have minimal obstruction and interference to LED light elements. Connectors for LED boards, while effective in connecting the LED board to electrical wires, can create obstruction and interference to LED lights by stacking additional height to the profile of an LED board. Because LED lights are of minimal dimension, obstruction introduced by any additional height can be significant. As disclosed herein, metal track with an integrated recess can be used in an LED connector board assembly to accommodate an LED board connected to, for example, leaf spring connectors with extended integral insulating bosses or sleeves (if desired) for electrical wires, thus reducing height introduced by the connection between the LED board and the leaf spring connectors.

The assembly systems and methods can be provided with a metal track to which the LED board and connectors can be attached. The connectors of the present disclosure can be a set of leaf springs connectors attached to an injection molded base. The set of leaf spring connectors can be attached to the injection molded base (e.g., via integral molding, melting of the base around a portion of the leaf spring, adhesive, rivets, and the like) and the base in turn can be provided with curved wings or lateral protrusions extending from two opposite sides of the base. The metal track of the disclosed systems and methods can be provided with an integral recess that receives the injection molded base in which the recess can further be provided with notches on opposite sides of the recess that receive the curved wings of the injection molded base. The notches can be sized to match different sized wings/protrusions on the body so as to ensure a single proper installation to avoid mismatching polarity of conductors.

In one embodiment of the present disclosure, the injection molded base can be of rectangular shape with a top surface, a bottom surface, and a curved or ridged side, defining a minimal height for the base, running along and in between the top and the bottom surfaces. The injection molded base can be provided with a securing hole in the center of the base for connection to the LED board, via a securing element such as a screw. The injection molded base can be further provided with a plurality of wire openings situated diagonally across the top and bottom surfaces of the base. The injection molded base can also be provided with a set of curved wings or lateral protrusions along the length sides of the rectangular base. In a further embodiment, one of the curved wings can be of a length that is longer than the other, so as to facilitate correct installation to avoid mismatching of polarity.

In another embodiment of the present disclosure, posts for securing the set of leaf spring connectors can be provided on the top surface of the injection molded base, along each of the width sides of the base. In a preferred embodiment of the present disclosure, the posts are integrally formed with the body from a thermoplastic that can be melted onto/around a portion of the leaf spring.

In accordance with another aspect of the present disclosure, the injection molded base can be further provided with a set of wire insulating bosses extending from the bottom surface of the base. In another embodiment of the present disclosure, the insulating bosses can be provided diagonally across from each other on the bottom surface of the base and are matched in dimensions and locations to the two wire openings provided on the top and bottom surfaces of the base. The bosses define a conduit therethrough for passage of the conductors, and prevent conductive material in the conductors from contacting the metal track.

In accordance with another aspect of the present disclosure the LED board can be provided with notched sides to accommodate securing element that can be used to connect the LED board to the set of leaf spring connectors.

In accordance with one aspect of the present disclosure, a set of electrical wires can be guided to the set of leaf spring connectors through the set of insulating bosses at the bottom surface of the injection molded base. The leaf spring connectors can be secured onto the top surface of the injection molded base by melting the posts provided on the top surface of the base. The set of electrical wires can be guided through the insulating bosses to the top surface of the injection molded base via the two wire openings on the base. Once the electrical wires are guided to the top surface of the injection molded base, the wires can be soldered to the set of leaf spring connectors or connected in any other desired fashion, such as crimping and the like.

In accordance with another aspect of the present disclosure, the assembly of electrical wires, injection molded base and leaf spring connectors can be placed into a recess of a metal track shaped and sized to the same dimensions as that of the injection molded base so that the injection molded base can securely fit within the recess. In a preferred embodiment of the present disclosure, the track defines a hole therethrough for receiving and securing the LED board and the injection molded base to the track. The hole may be defined through a recessed portion of the track. The recess can also be provided with two wire openings diagonally across from each other such that their locations and dimensions are matched with those of the wire openings in the injection molded base and that a set of electrical wires can be guided through the wire openings when the injection molded base is placed inside of the recess.

In further accordance with the present disclosure, upon placing the injection molded base into the recess in the metal track and guiding the electrical wires through the wire openings, an LED board is placed on top of the metal track such that a notch, for securing the LED board, on one side of the LED board is aligned with the securing hole centered in the injection molded base as well as the securing hole centered in the recess of the metal track, and the assembly of LED board, injection molded base and metal track is stacked and secured together via a securing member such as a screw.

Various other aspects and embodiments of the present disclosure are described in further detail below. It has been contemplated that features of one embodiment of the disclosure may be incorporated in other embodiments thereof without further recitation.

The Summary is neither intended nor should it be construed as being representative of the full extent and scope of the present disclosure. All objects, features and advantages of the present disclosure will become apparent in the following detailed written description and in conjunction with the accompanying drawings.

Figure 1:
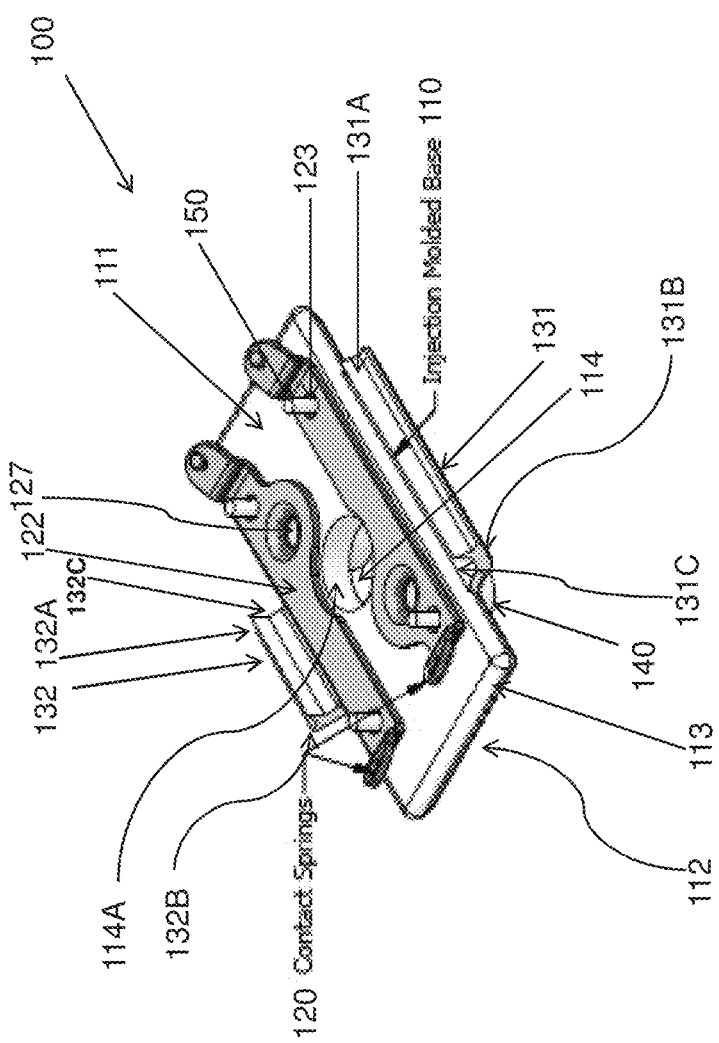
FIG. 1 illustrates an injection molded base with a set of leaf spring connectors disposed on the top surface of the injection molded base in accordance with one embodiment of the present disclosure.

The images in the drawings are simplified for illustrative purposes and are not depicted to scale. To facilitate understanding, identical reference numerals are used in the drawings to designate, where possible, substantially identical elements that are common to the figures, except that alpha-numerical extensions and/or suffixes may be added, when appropriate, to differentiate such elements.

DETAILED DESCRIPTION

Figure 11:
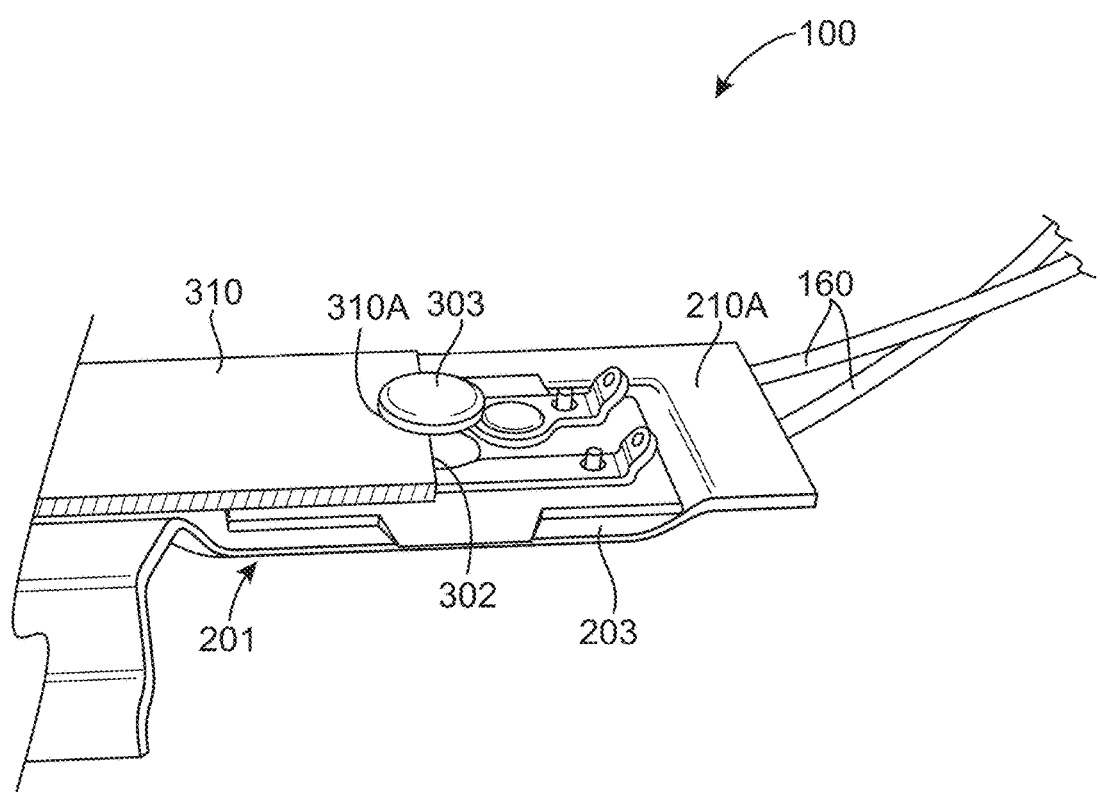
FIG. 11 illustrates a cross-sectional view of the metal track with an integrated recess for receiving an assembly of electrical wires, injection molded base and a set of leaf spring connectors in accordance with a preferred embodiment of the present disclosure.

For purpose of explanation and illustration, and not limitation, an exemplary embodiment of an LED connector board assembly in accordance with the present disclosure is shown in FIG. 11, and is designated generally by reference number too. This exemplary embodiment is also depicted in the remaining figures.

Generally, a LED connector board assembly too of the present disclosure includes a set of leaf spring connectors 120, which can be made out of an electrically conductive material for connecting electrical wires 160 to an LED board 310, an injection molded base 110 to which spring connectors 120 can be attached, and a metal track 201 with an integrated recess 203 for accommodating the injection molded base 110 and upon which the LED board 310 can be attached.

As illustrated in FIG. 1, leaf spring connectors 120 can be attached to a top surface 111 of the injection molded base 110. Injection molded base 110 can be a three-dimensional rectangle with a top surface 111, a bottom surface 112, and a curved side 113 running between top surface 111 and bottom surface 112, defining a minimal height for injection molded base 110. Injection molded base 110 can also be provided with lateral curved wings or protrusions 131 and 132 extending from each of the lengthwise sides of injection molded base 110.

In a preferred embodiment, as illustrated in FIG. 1, curved wing or protrusion 131 can be of a length longer than that of curved wing or protrusion 132. Wings 131 and 132 can be provided to curve away from top surface 111 of injection molded base 110. Curved wing 131 can have a concaved outward facing surface 131A, a convex outer surface 131B, and a concaved upward facing surface 131C. Similarly, curved wing 132 can have a concaved outward facing surface 132A, a convex outer surface 132B, and a concaved upward facing surface 132C.

In accordance with one aspect of the present disclosure, injection molded base 110 can also be provided with a securing hole 114 in the center of base 110 for attaching base 110 to assembly too, whereby securing hole 114 has an inner cylindrical surface 114A.

Figure 2:
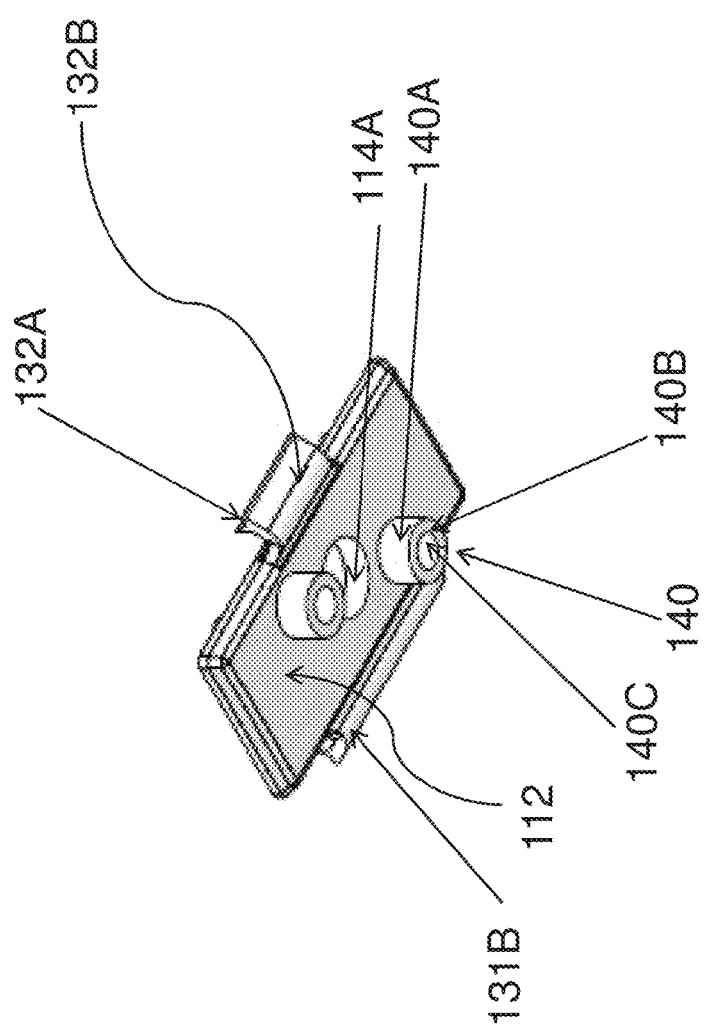
FIG. 2 illustrates a bottom view of an injection molded base in accordance with a preferred embodiment of the present disclosure.

In a preferred embodiment, as illustrated in FIG. 2, injection molded base 110 can further be provided with one or more insulating bosses 140 through which electrical wires 160 can pass, whereby each of the bosses 140 can be of a cylindrical shape with an outer surface 140A, an inner surface 140C, and a circular rim 140B connecting outer surface 140A to inner surface 140C.

Figure 3:
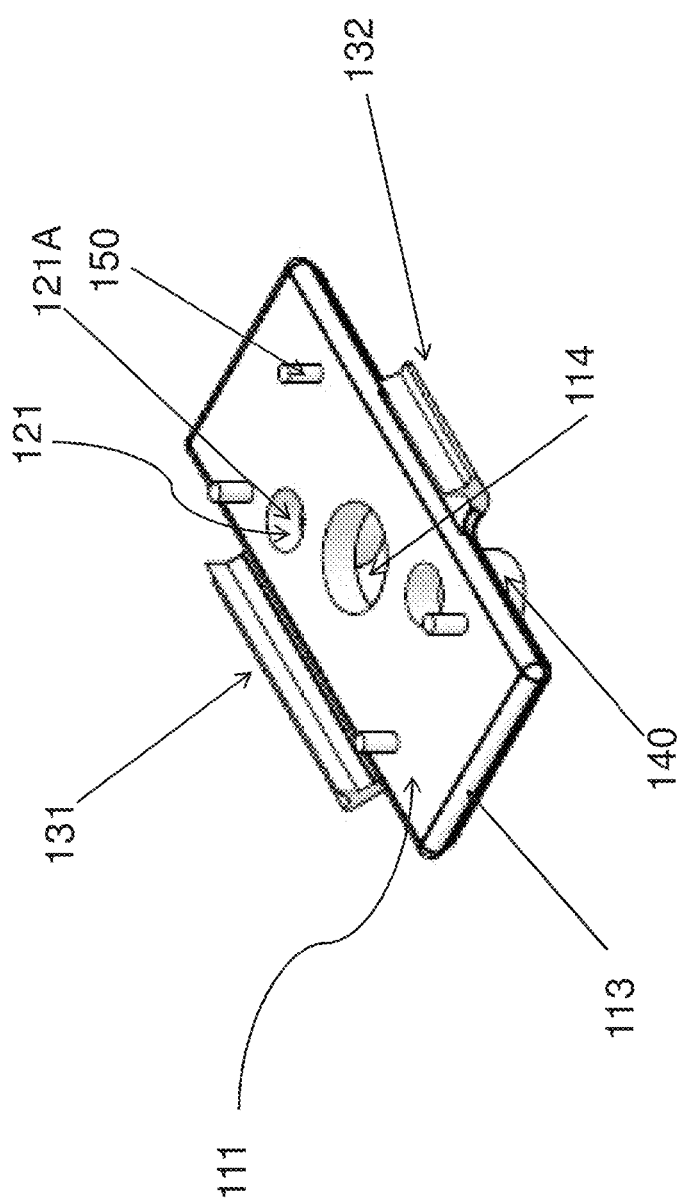
FIG. 3 illustrates a top perspective view of the injection molded base according to one embodiment of the present disclosure.

As further illustrated in FIG. 3, in a preferred embodiment of the present disclosure, insulating bosses 140 can be aligned to a set of wire openings 121 in injection molded base 110 to which electrical wires 160 can be passed. Wire openings 121 can be of cylindrical shape that is of the same radial dimension as that of insulating bosses 140, each with an inner cylindrical surface 121A. Wire openings 121 can also be diagonally aligned with securing hole 114 as shown in FIG. 3.

Figure 4:
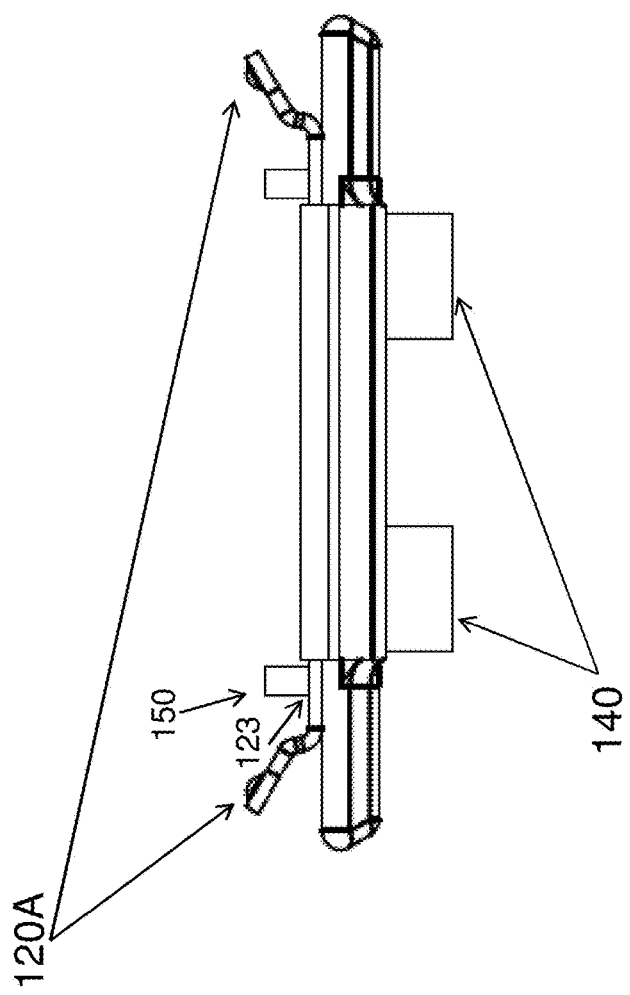
FIG. 4 illustrates a lengthwise side view of the injection molded base with a set of leaf spring connectors disposed on the top surface of the injection molded base in accordance with one embodiment of the present disclosure.

In accordance with another aspect of the present disclosure, as illustrated in FIGS. 3 and 4, injection molded base 110 can be further provided with one or more posts 150 of cylindrical shape. Posts 150 can be used to attach leaf spring connectors 120 to top surface 111 of injection molded base 110 by melting the material of the post 150 over the leaf spring connector to hold it in place. It will be further appreciated that leaf spring connectors 120 can be attached via adhesive, fasteners, and the like.

Figure 5:
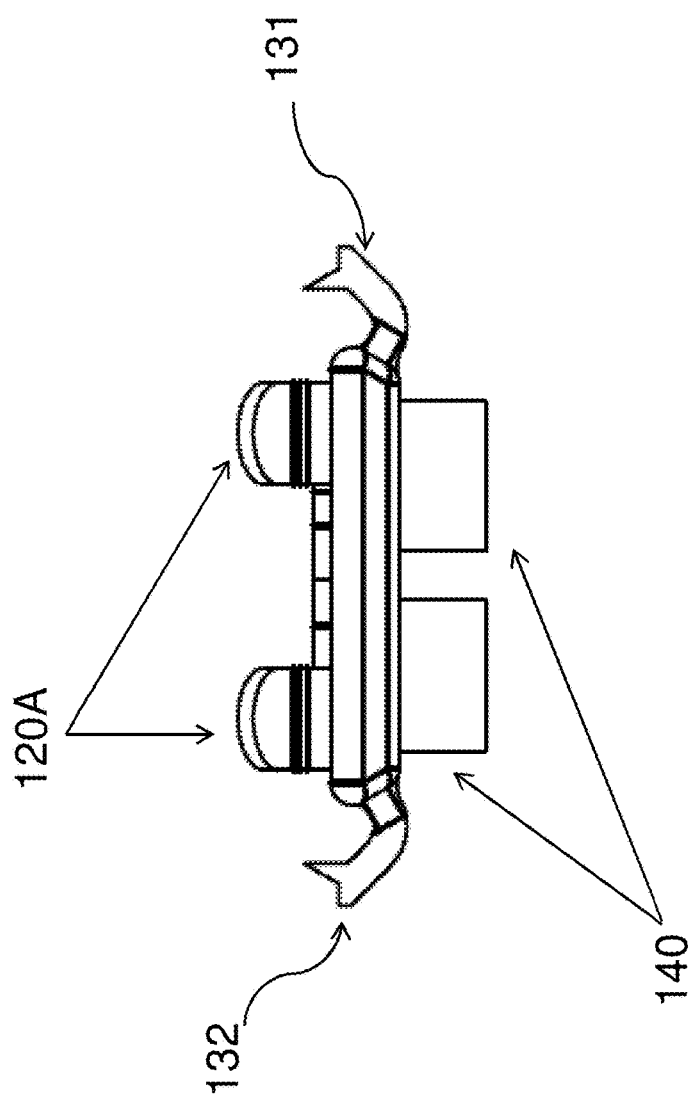
FIG. 5 illustrates a widthwise side view of the injection molded base with a set of leaf spring connectors disposed on the top surface of the injection molded base in accordance with one embodiment of the present disclosure.
Figure 6:
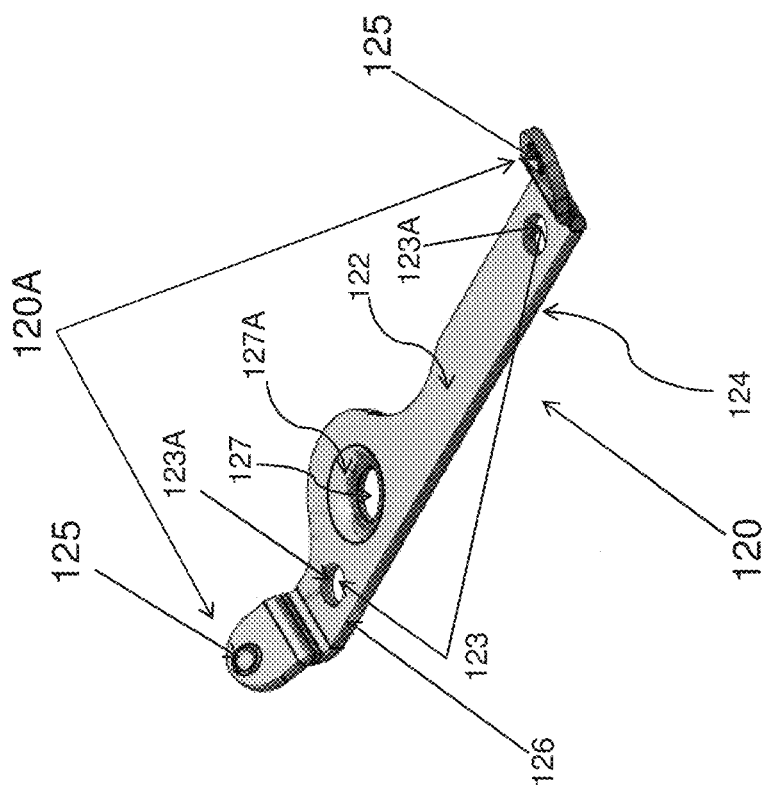
FIG. 6 illustrates a top perspective view of one of the set of leaf spring connectors in accordance with one embodiment of the present disclosure.

In accordance with one aspect of the present disclosure, as illustrated in FIGS. 4, 5 and 6, leaf spring connectors 120 can have a set of compressible contact springs 120A on each of its widthwise ends. As shown in FIG. 6, each leaf spring connector 120 can be three-dimensional of generally rectangular shape whereby each leaf spring connector can be provided with a top surface 122, a bottom surface 124, and a side 126 of a minimal height running between top surface 122 and bottom surface 124. As further shown in FIG. 6, each of the leaf contact springs 120A, can be provided with a set of leaf spring contact buds 125.

In a preferred embodiment, each of the leaf spring connectors 120, as illustrated in FIG. 6, can be provided with one or more post openings through which posts 150 can pass whereby each of the post openings can be of cylindrical shape provided with a cylindrical inner surface 123A and sufficiently sized to receive posts 150.

Further, in accordance with another aspect of the present disclosure, each of the leaf spring connectors 120, as also shown in FIG. 6, can also be provided with a wire opening with an inner cylindrical surface 127A whereby wire opening 127 on each of the leaf spring connectors 120, when assembled with injection molded base 110, can be aligned with wire opening 121 provided on injection molded base 110 to provide a pass through to wires 160 to top surface 122 of each leaf spring connector 120.

Figure 7:
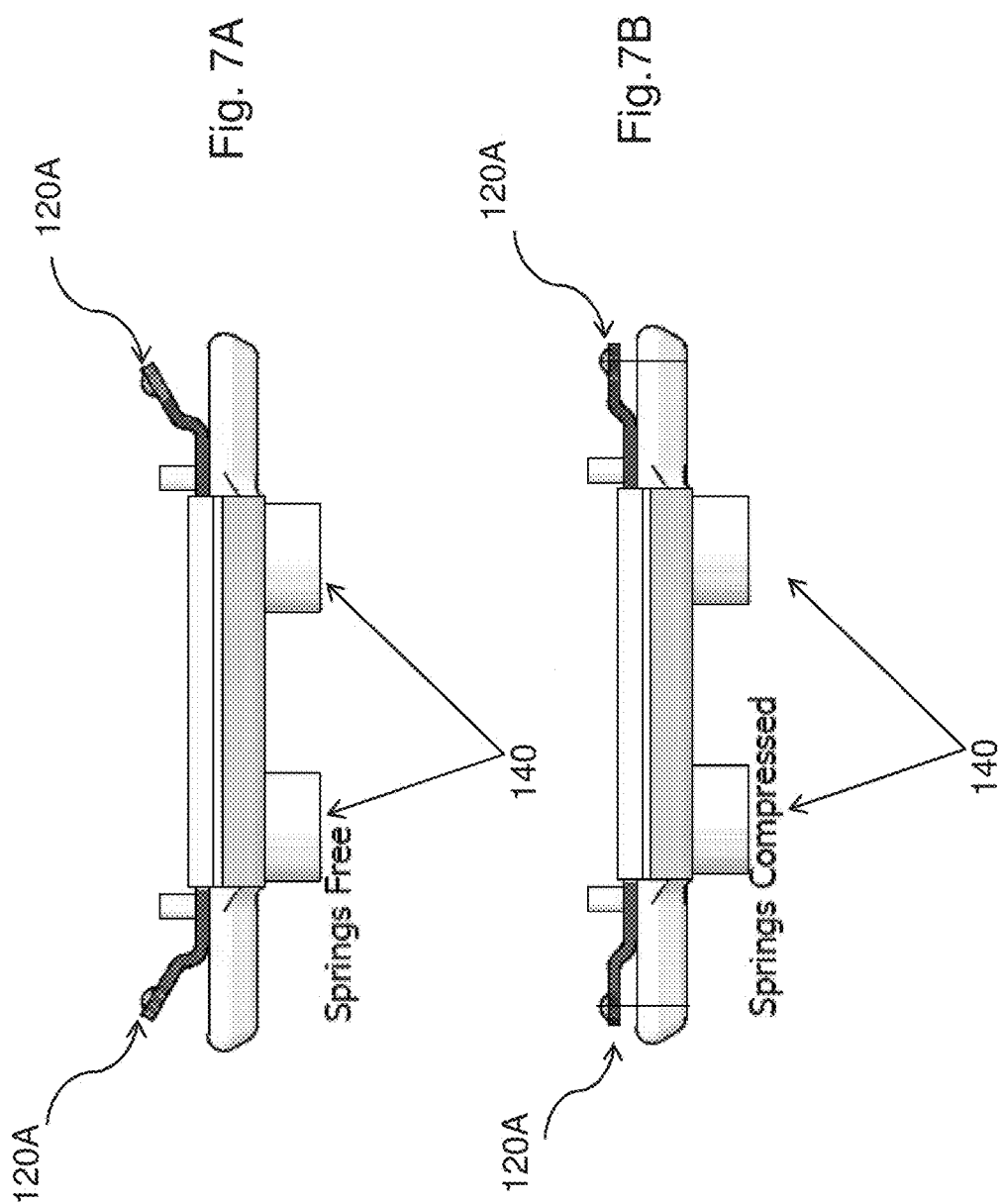
FIG. 7A illustrates a lengthwise side view of the injection molded base with a set of leaf spring connectors disposed on the top surface of the injection molded base whereby the spring connectors are free of compression in accordance with one embodiment of the present disclosure.
FIG. 7B illustrates a lengthwise side view of the injection molded base with a set of leaf spring connectors disposed on the top surface of the injection molded base whereby the spring connectors are compressed towards the top surface of the injection molded base in accordance with one embodiment of the present disclosure.

In accordance with one aspect of the present disclosure, as further illustrated in FIG. 7A, in an uncompressed and free state, contact springs 120A can be raised away from top surface 111 of injection molded base 110. Whereas in a compressed state, as illustrated in FIG. 7B, contact springs 120A can be depressed toward top surface 111 of injection molded base 110.

Figure 8:
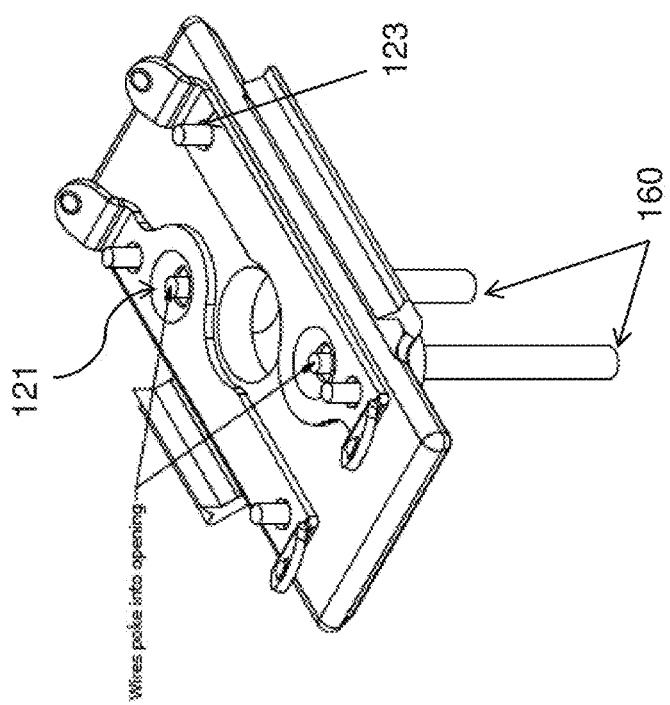
FIG. 8 illustrates one aspect of the assembling a set of leaf spring connectors and an injection molded base in accordance with one embodiment of the present disclosure.

Reference will now be made to describe a representative method of using an embodiment of the present disclosure. The method includes disposing leaf spring connectors 120 onto top surface 111 of injection molded base 110 via securing posts 150 through to post openings onto top surface 111 of injection molded base 110, as shown in FIG. 8. The method can further include passing electrical wires 160 through to injection molded base 110 via one or more insulating bosses 140 that extend from bottom surface 112 of injection molded base 110 via wire openings 121.

Figure 9:
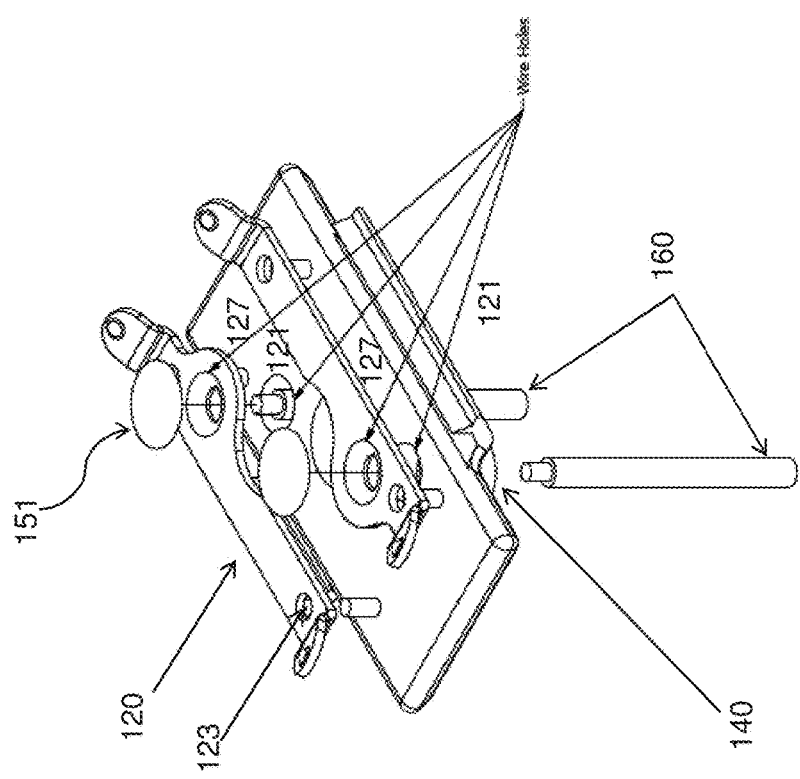
FIG. 9 illustrates another aspect of the assembling of a set of leaf spring connectors and an injection molded base in accordance with one embodiment of the present disclosure.
Figure 10:
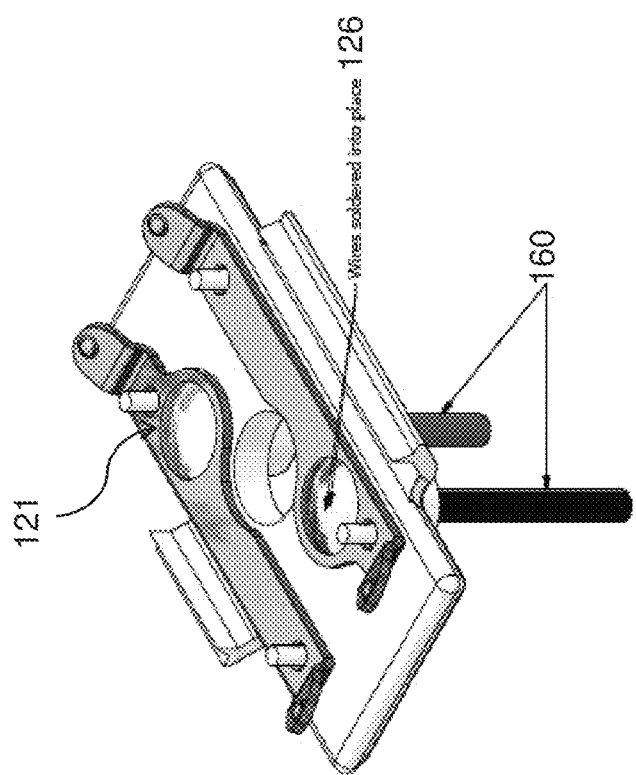
FIG. 10 illustrates yet another aspect of the assembling of a set of leaf spring connectors and an injection molded base in accordance with one embodiment of the present disclosure.

As further illustrated in FIG. 9, in accordance with another aspect of the present disclosure, each of the electrical wires 160 can be passed through from top surface 111 of injection molded base 110 to top surface 122 of each of the leaf spring connector 120 via wiring openings 127 and each of the electrical wires 160 can be further secured to top surface 122 of each of the leaf spring connector 120 via one or more securing cap 151, by for example, soldering the one or more securing cap 151 to the respective wire opening 127, as shown in FIG. 10.

Figure 12:
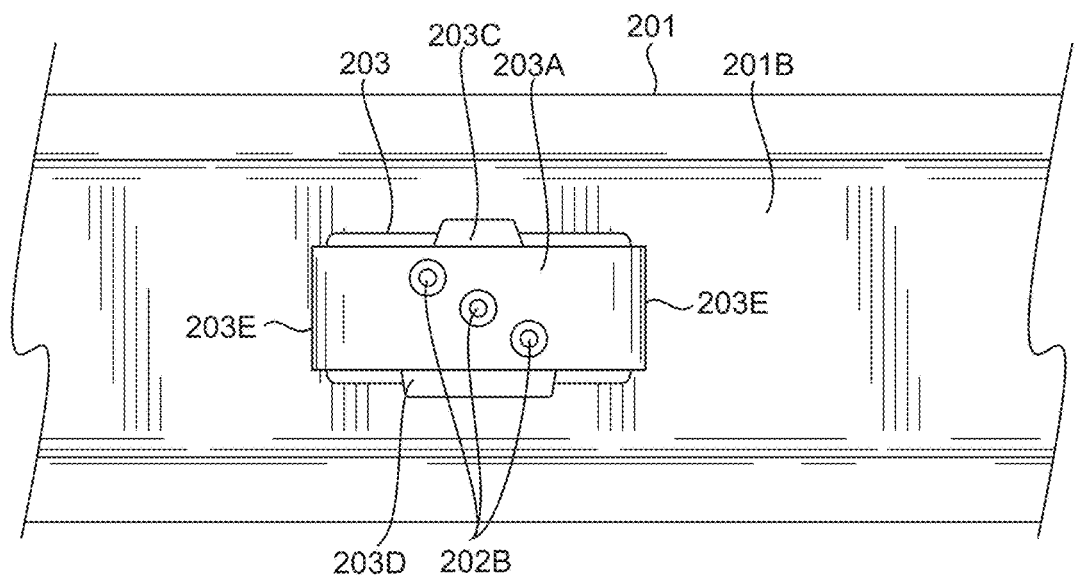
FIG. 12 illustrates a bottom view of a metal track with an integrated recess for receiving an assembly of electrical wires, injection molded base and a set of leaf spring connectors in accordance with a preferred embodiment of the present disclosure.
Figure 13:
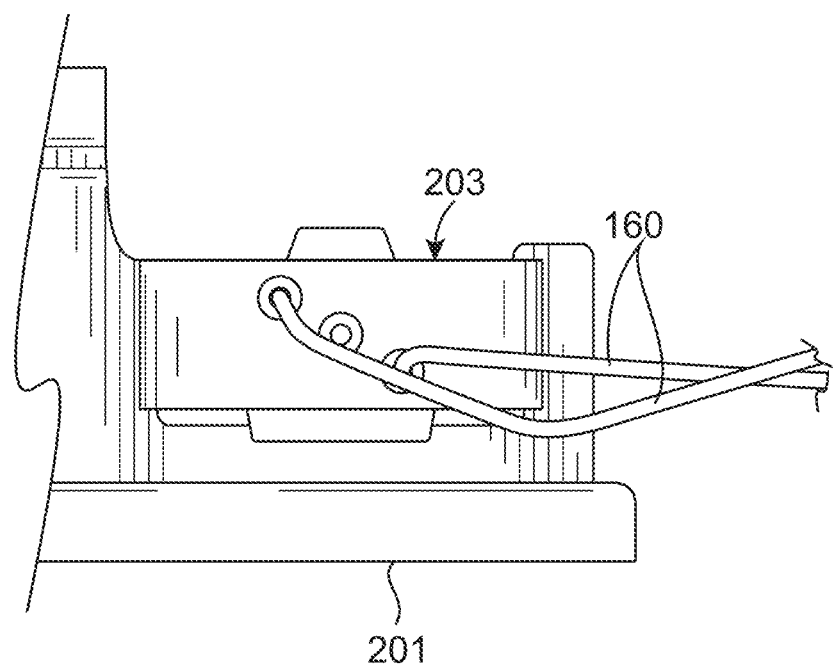
FIG. 13 illustrates another view of the metal track with an integrated recess for receiving an assembly of electrical wires, injection molded base and a set of leaf spring connectors in accordance with a preferred embodiment of the present disclosure.

In accordance with another aspect of the present disclosure, the assembled leaf spring connectors 120 and injection molded base 110 with soldered electrical wires 160 are placed in recess 203 of metal track 201 wherein electrical wires 160 can be passed through wire openings 202B as shown in FIGS. 12 and 13.

In a preferred embodiment of the present disclosure, as shown in FIG. 11, a metal track 201 can be provided with an integrated recess 203, whereby recess 203 can be of rectangular shape that substantially matches the size and dimension of that of injection molded base 110. Metal track 201 can be provided with top surface 201A and bottom surface 201B. As illustrated in FIG. 11, recess 203 can be provided with a bottom surface 203A, which can accommodate openings 202B for passing through electrical wires 160 and securing element 303. Further, as illustrated in FIG. 12, recess 203 can be provided with sleeves 203C and 203D, which substantially match the size and dimension of wings 131 and 132 of injection molded base 110. Sleeves 203C and 203D can preferably protrude from bottom surface 201B of metal track 201. Moreover, sides 203E of recess 203 can protrude to the same degree as that of sleeves 203C and 203D, such that in accordance with a preferred embodiment of the present disclosure, injection molded base 110 can securely fit within recess 203 in metal track 201, as shown in FIG. 11, so as to minimize height of the profile of the LED connector board assembly.

In accordance with a further aspect of the present disclosure, upon passing electrical wires 160 of the assembled leaf spring connectors 120 and injection molded base 110 through openings 202B of metal track 201, and fitting the assembly within recess 203 of metal track 201, LED board 310 can be further secured onto the assembly by placing LED board 310 onto top surface 201A of metal track 201 and securing LED board 310 to the assembly of leaf spring connectors 120 and injection molded base 110 via notch 310A on side 302 of LED board 310. In a preferred embodiment, a notch 310A on side 302 of LED board 310 can be aligned with securing hole 114 on injection molded base 110, which can also be aligned with a center opening of openings 202B on metal track 201, as shown in FIG. 11.

Although the present disclosure herein has been described with reference to particular preferred embodiments thereof, it is to be understood that these embodiments are merely illustrative of the principles and applications of the disclosure. Therefore, modifications may be made to these embodiments and other arrangements may be devised without departing from the spirit and scope of the disclosure.

What is claimed is:

1. A method for assembling an LED connector board comprising the steps of:
   securing a set of leaf spring connectors on a top surface of an injection molded base;
   securing one or more electrical wires to the injection molded base by passing the electrical wires through to the top surface of the injection molded base via one or more insulating bosses extended from a bottom surface of the injection molded base through to one or more wire openings in the injection molded base;
   placing the injection molded base inside of an integrated recess on a metal track and passing the electrical wires through one or more of wire openings in the integrated recess;

placing an LED board on a top surface of the metal track wherein a circular notch on a widthwise side of the LED board is aligned with a securing hole in the injection molded base and a securing hole in the integrated recess;

securing the LED board to the metal track by attaching the LED board to the injection molded base and the integrated recess via a securing element that passes through the circular notch on the widthwise side of the LED board, the securing hole in the injection molded base and the securing hole in the integrated recess.

2. The method of claim 1, wherein the set of leaf spring connectors is connected to the top surface of the injection molded base via melting thermoplastic posts that passes through post openings in the leaf spring connectors.

3. The method of claim 1, wherein the electrical wires are secured to the injection molded base by soldering one or more securing caps to the ends of the electrical wires and the set of leaf spring connectors when the wires pass through to the wire openings of the leaf spring connectors.

* * * * *